United States Patent
Kato et al.

(10) Patent No.: US 6,330,755 B1
(45) Date of Patent: Dec. 18, 2001

(54) VACUUM PROCESSING AND OPERATING METHOD

(75) Inventors: Shigekazu Kato, Kudamatsu; Kouji Nishihata, Tokuyama; Tsunehiko Tsubone, Hikari; Atsushi Itou, Kudamatsu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/461,432

(22) Filed: Dec. 16, 1999

Related U.S. Application Data

(63) Continuation of application No. 09/177,495, filed on Oct. 23, 1998, now Pat. No. 6,012,235, which is a continuation of application No. 09/061,062, filed on Apr. 16, 1998, now Pat. No. 5,950,330, which is a continuation of application No. 08/882,731, filed on Jun. 26, 1997, now Pat. No. 5,784,799, which is a division of application No. 08/593,870, filed on Jan. 30, 1996, now Pat. No. 5,661,913, which is a continuation of application No. 08/443,039, filed on May 17, 1995, now Pat. No. 5,553,396, which is a division of application No. 08/302,443, filed on Sep. 9, 1994, now Pat. No. 5,457,896, which is a continuation of application No. 08/096,256, filed on Jul. 26, 1993, now Pat. No. 5,349,762, which is a continuation of application No. 07/751,951, filed on Aug. 29, 1991, now Pat. No. 5,314,509.

(30) Foreign Application Priority Data

Aug. 29, 1990 (JP) ................................................. 2-225321

(51) Int. Cl.$^7$ ....................................................... F26B 5/04
(52) U.S. Cl. ............................................................ 34/406
(58) Field of Search ............................. 34/406, 92, 228, 34/229; D32/1; 414/222, 225, 226, 331, 939, 940; 134/21, 31, 32, 40, 105, 902

(56) References Cited

U.S. PATENT DOCUMENTS 3,652,444   3/1972   Lester et al. .

| | | |
|---|---|---|
| 3,981,791 | 9/1976 | Rosvold . |
| 4,138,306 | 2/1979 | Niwa ..................................... 156/345 |

(List continued on next page.)

FOREIGN PATENT DOCUMENTS

| | | |
|---|---|---|
| 20246453 | 4/1987 | (EP) . |
| 20381338 | 5/1990 | (EP) . |

(List continued on next page.)

OTHER PUBLICATIONS

R.P.H. Chang, "Multipurpose plasma reactor for materials research and processing", J. Vac. Sci. Technol., vol. 14, No. 1, Jan./Feb. 1977, pp. 278–280.

(List continued on next page.)

*Primary Examiner*—Stephen Gravini
(74) *Attorney, Agent, or Firm*—Antonelli, Terry, Stout & Kraus, LLP.

(57) ABSTRACT

This invention relates to a vacuum processing apparatus having vacuum processing chambers the insides of which must be dry cleaned, and to a method of operating such an apparatus. When the vacuum processing chambers are dry-cleaned, dummy substrates are transferred into the vacuum processing chamber by substrates conveyor means from dummy substrate storage means which is disposed in the air atmosphere together with storage means for storing substrates to be processed, and the inside of the vacuum processing chamber is dry-cleaned by generating a plasma. The dummy substrate is returned to the dummy substrate storage means after dry cleaning is completed. Accordingly, any specific mechanism for only the cleaning purpose is not necessary and the construction of the apparatus can be made simple. Furthermore, the dummy substrates used for dry cleaning and the substrates to be processed do not coexist, contamination of the substrates to be processed due to dust and remaining gas can be prevented and the production yield can be high.

32 Claims, 1 Drawing Sheet

U.S. PATENT DOCUMENTS

| | | |
|---|---|---|
| 4,226,897 | 10/1980 | Coleman . |
| 4,311,427 | 1/1982 | Coad et al. . |
| 4,313,783 | 2/1982 | Davies et al. . |
| 4,313,815 | 2/1982 | Graves, Jr. et al. . |
| 4,318,767 | 3/1982 | Hijikata et al. . |
| 4,449,885 | 5/1984 | Hertel et al. . |
| 4,457,661 | 7/1984 | Flint et al. . |
| 4,534,314 | 8/1985 | Ackley . |
| 4,563,240 | 1/1986 | Shibata et al. . |
| 4,576,698 | 3/1986 | Gallagher et al. ............... 204/192 |
| 4,634,331 | 1/1987 | Hertel . |
| 4,643,629 | 2/1987 | Takahashi et al. ............... 414/331 |
| 4,705,951 | 11/1987 | Layman et al. . |
| 4,715,764 | 12/1987 | Hutchinson . |
| 4,824,309 | 4/1989 | Kakehi et al. ................ 414/217 |
| 4,836,733 | 6/1989 | Hertel et al. . |
| 4,836,905 | 6/1989 | Davis et al. . |
| 4,851,101 | 7/1989 | Hutchinson . |
| 4,895,107 | 1/1990 | Yano et al. . |
| 4,902,934 | 2/1990 | Miyamura et al. . |
| 4,903,937 | 2/1990 | Jakuniec et al. . |
| 4,909,695 | 3/1990 | Hurwitt et al. . |
| 4,911,597 | 3/1990 | Maydan et al. . |
| 4,915,564 | 4/1990 | Eror et al. . |
| 4,917,556 | 4/1990 | Stark et al. . |
| 4,923,584 | 5/1990 | Bramhall, Jr. et al. . |
| 4,924,890 | 5/1990 | Giles et al. ..................... 134/902 |
| 4,936,329 | 6/1990 | Michael et al. .................. 134/902 |
| 4,951,601 | 8/1990 | Maydan et al. ............... 414/217 X |
| 4,969,790 | 11/1990 | Petz et al. . |
| 5,007,981 | 4/1991 | Kawasaki et al. . |
| 5,014,217 | 5/1991 | Savage ........................... 364/550 |
| 5,225,036 * | 7/1993 | Watanabe et al. ............... 156/643 |
| 5,292,393 | 3/1994 | Maydan et al. . |
| 5,351,415 | 10/1994 | Brooks et al. ..................... 34/389 |
| 5,436,848 | 7/1995 | Nishida et al. . |
| 5,452,166 | 9/1995 | Aylwin et al. . |
| 5,462,397 | 10/1995 | Iwabuchi ........................ 414/222 |
| 5,504,033 | 4/1996 | Bajor et al. . |
| 5,504,347 | 4/1996 | Jovanovic et al. . |
| 5,509,771 | 4/1996 | Hiroki ............................. 414/217 |
| 5,556,714 | 9/1996 | Fukuyama et al. . |
| 5,651,858 | 7/1997 | Lin . |
| 5,675,461 | 10/1997 | Aylwin et al. . |
| 5,685,684 | 11/1997 | Kato et al. ....................... 414/217 |
| 5,829,939 * | 11/1998 | Iwai et al. ........................ 414/411 |
| 5,934,856 * | 8/1999 | Asakawa et al. ................ 414/217 |

FOREIGN PATENT DOCUMENTS

| | | |
|---|---|---|
| 57-29577 | 2/1982 | (JP) . |
| 60-246635 | 12/1985 | (JP) . |
| 62-44571 | 2/1987 | (JP) . |
| 62-50463 | 3/1987 | (JP) . |
| 62-89881 | 4/1987 | (JP) . |
| 62-207866 | 9/1987 | (JP) . |
| 63-153270 | 6/1988 | (JP) . |
| 636582 | 1/1989 | (JP) . |
| 6412037 | 1/1989 | (JP) . |
| 131970 | 2/1989 | (JP) . |
| 131971 | 2/1989 | (JP) . |
| 1135015 | 5/1989 | (JP) . |
| 1-251734 | 10/1989 | (JP) . |
| 1-310553 | 12/1989 | (JP) . |
| 1298180 | 12/1989 | (JP) . |
| 2-61064 | 3/1990 | (JP) . |
| 265252 | 3/1990 | (JP) . |
| 2-106037 | 4/1990 | (JP) . |
| 294647 | 4/1990 | (JP) . |
| 430549 | 4/1992 | (JP) . |
| 8707309 | 5/1987 | (WO) . |

OTHER PUBLICATIONS

Semiconductor Equipment Association of Japan, Terminological Dictionary of Semiconductor Equipment), front, table, p. 183, back, Nov. 20, 1987.

Semiconductor Equipment Association of Japan, "Semiconductor News", vol. 4, pp. 38–43, Apr. 10, 1987 (w/translation).

* cited by examiner

VACUUM PROCESSING AND OPERATING METHOD

This application is a Continuation application of application Ser. No. 09/177,495, filed Oct. 23, 1998, now U.S. Pat. No. 6,012,235, which is a Continuation application of application Ser. No. 09/061,062, filed Apr. 16, 1998, now U.S. Pat. No. 5,950,330, which is a Continuation application of application Ser. No. 08/882,731, filed Jun. 26, 1997, now U.S. Pat. No. 5,784,799, which is a Divisional application of application Ser, No. 08/593,870, filed Jan. 30, 1996, now U.S. Pat. No. 5,661,913 which is a Continuing application of application Ser. No. 08/443,039, filed May 17, 1995, now U.S. Pat. No. 5,553,396, which is a Divisional application of application Ser. No. 08/302,443, filed Sep. 9, 1994, now U.S. Pat. No. 5,457,896, which is a Continuing application of application Ser. No. 08/096,256, filed Jul. 26, 1993, now U.S. Pat. No. 5,349,762, which is a Continuing application of application Ser. No. 07/751,951, filed Aug. 29, 1991, now U.S. Pat. No. 5,314,509.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparatus and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988. This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual gas used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means for storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
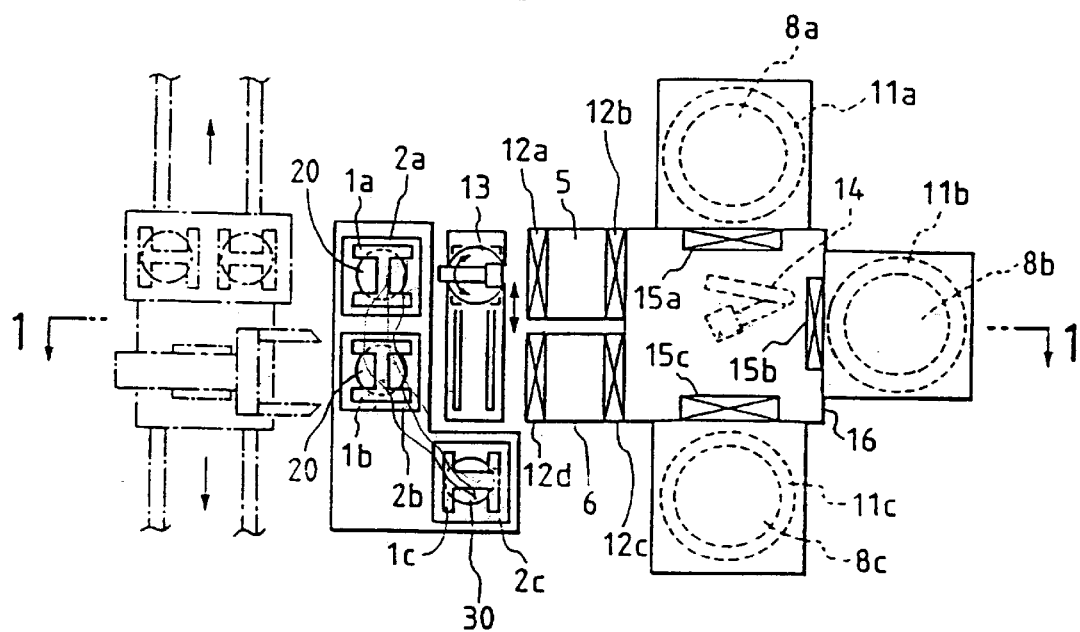
FIG. 1 is a plan view of a dry etching apparatus as an embodiment of a vacuum processing apparatus in accordance with the present invention.
Figure 2:
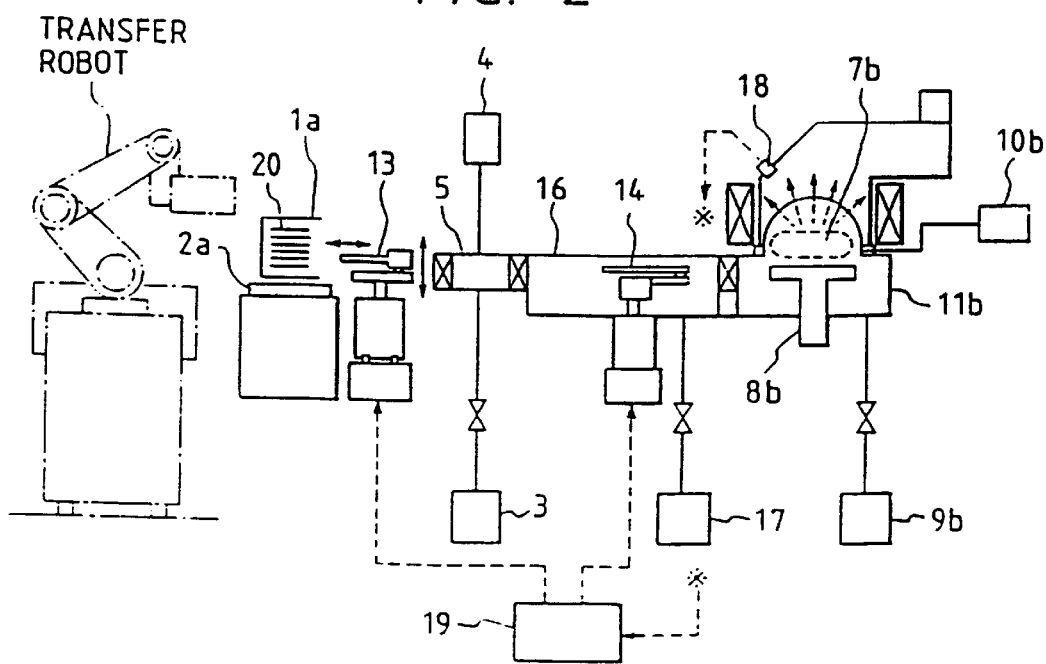
FIG. 2 is a vertical sectional view taken along line 1—1 of FIG. 1.

FIGS. 1 and 2 show a vacuum processing apparatus of the present invention which is, in this case, a dry-etching apparatus for etching wafers, i.e., substrates to be processed by plasma.

Cassette tables 2a to 2c are disposed in an L-shape in this case in positions such that they can be loaded into and unloaded from the apparatus without changing their positions and postures. In other words, the cassettes 1a to 1c are fixed always in predetermined positions on a substantially horizontal plane, while the cassette tables 2a and 2b are disposed adjacent to and in parallel with each other on one of the sides of the L-shape. The cassette table 2c is disposed on the other side of the L-shape. The cassettes 1a and 1b are for storing unprocessed wafers and for recovering the processed wafers. They can store a plurality (usually 25) of wafers 20 as the substrates to be treated. The cassette 1c in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables 2a and 2b, and a conveyor 13 is disposed between the cassette tables 2a, 2b and the load lock chamber 5 and the unload lock chamber 6. The load lock chamber 5 is equipped with an evacuating device 3 and a gas introduction device 4, and can load unprocessed wafers in the vacuum apparatus through a gate valve 12a. The unload lock chamber 6 is similarly equipped with the evacuating device 3 and the gas introduction device 4, and can take out processed wafers to the atmosphere through a gate valve 12d. The conveyor 13 is equipped with a robot having X, Y, Z and axes, which operates so as to deliver and receive the wafers 20 between the cassettes 1a, 1b and the load lock and unload lock chambers 5 and 6 and the dummy wafers 30 between the cassette 1c and the load lock and unload lock chambers 5 and 6.

The load lock chamber 5 and the unload lock chamber 6 are connected to a transfer chamber 16 through the gate valves 12b and 12c. The transfer chamber 16 is rectangular, in this case, and etching chambers 11a, 11b and 11c are disposed on the three side walls of the transfer chamber 16 through gate valves 15a, 15b and 15c, respectively. A conveyor 14 capable of delivering the wafers 20 or the dummy wafers 30 from the load lock chamber 5 to the etching chambers 11a, 11b, 11c and of delivering them from the chambers 11a, 11b, 11c to the unload lock chamber 6 is disposed inside the transfer chamber 16. The transfer chamber 16 is equipped with an evacuating device 17 capable of independent evacuation.

The etching chambers 11a, 11b, 11c have the same structure and can make the same processing. The explanation will be given on the etching chamber 11b by way of example. The etching chamber 11b has a sample table 8b for placing the wafers 20 thereon, and a discharge chamber is so provided as to define a discharge portion 7b above the sample table 8b. The etching chamber 11b includes a gas introduction device 10b for introducing a processing gas in the discharge portion 7b and an evacuating device 9b for decreasing the internal pressure of the etching chamber 11b to a predetermined pressure. The etching chamber 11b further includes generation means for generating a microwave and a magnetic field for converting processing gas in the discharge portion 7b to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette 1c and the etching chambers 11a to 11c.

In a vacuum processing apparatus having the construction described above, the cassettes 1a, 1b storing unprocessed wafers are first placed onto the cassette tables 2a, 2b by a line transfer robot which operates on the basis of the data sent from a host control apparatus, or by an operator. On the other hand, the cassette 1c storing the dummy wafers is placed on the cassette table 2c. The vacuum processing apparatus executes the wafer processing or plasma cleaning on the basis of recognition by itself of the production data provided on the cassettes 1a to 1c, of the data sent from the host control apparatus, or of the command inputted by an operator.

For instance, the wafers 20 are sequentially loaded in the order from above into the etching chambers 11a, 11b, 11c by the conveyors 13 and 14, and are etched. The etched wafers are stored in their original positions inside the cassette 1a by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers 11a to 11c. Therefore, the original state must be recovered by removing the adhering matters by plasma cleaning. The controller 19 judges the timing of this plasma cleaning. In this case, a portion through which the plasma light passes is provided in each of the etching chambers 11a to 11c. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing of wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in any position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber 11a through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 11c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism for conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times of use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. A method of using a conveyor system for processing substrates in plural vacuum processing chamber installation portions, the conveyor system including:

an atmospheric loader, having a location for positioning at least one cassette containing the substrates, the location having an upper region which is open to a cassette transferring path;

a vacuum loader; and a lock chamber, having an atmospheric loader side and a vacuum loader side, and having a gate valve for said atmospheric loader side and another gate valve for said vacuum loader side, wherein said vacuum loader has (1) a transfer chamber connected to the lock chamber via the another gate valve, the method comprising the steps of:

transferring substrates, to be processed, from a cassette at said location of said atmospheric loader, to said lock chamber;

after transferring substrates to the lock chamber, providing a vacuum in said lock chamber;

after providing a vacuum in said lock chamber, transferring substrates to be processed, from said lock chamber to said transfer chamber;

thereafter, transferring processed substrates from said transfer chamber to said lock chamber; and transferring processed substrates from said lock chamber to said atmospheric loader from which the substrates had been transferred to the lock chamber.

wherein said gate valve and said another gate valve are opened and closed every carrying-in of a substrate, to be processed, to the lock chamber, and every carry-out a processed substrate from the lock chamber.

2. A method of transferring at least one wafer in a vacuum processing apparatus, comprising the steps of:

(i) placing a cassette containing at least one wafer to be processed, at a cassette table, the cassette table having an upper region thereover which is open to a cassette transferring path;

(ii) loading said at least one wafer sequentially in order from said cassette, by means of a first conveyor, to a load lock chamber, in which one wafer is to be disposed and therefrom, by means of a second conveyor, to a transfer chamber under vacuum; and (iii) after processing the wafers, unloading processed wafers from a plurality of vacuum processing chambers into said cassette at said cassette table, from which the wafers had been loaded, by means of the second conveyor in said transfer chamber under vacuum, an unload lock chamber, in which one wafer is to be disposed, and said first conveyor.

3. A method of transferring cassettes in operating a vacuum processing apparatus having plural vacuum processing chambers, the vacuum processing apparatus including:

an atmospheric loader, having a location for positioning at least one cassette containing samples, the location having an upper region which is open to a cassette transferring path;

a vacuum loader; and a lock chamber for connecting said atmospheric loader and said vacuum loader, said lock chamber having opening and closing devices for carry-in samples to be processed in the vacuum processing chambers into the lock chamber and for carry-out processed samples from the lock chamber, wherein said atmospheric loader includes a cassette mount unit located in front of said lock chamber, and said cassette mount unit has a cassette positioning plane in which all cassettes, containing the samples to be processed, are positioned in front of a front wall of said lock chamber, said cassette positioning plane being at said location, the method comprising a step of:

placing said cassette on and removing said cassette from said cassette mount unit which is in front of said lock chamber while maintaining a surface of the samples substantially horizontal, wherein the opening and closing devices of the lock chamber are opened and closed every carrying-in of a sample, to be processed, to the lock chamber, and every carrying-out of a processed sample from the lock chamber.

4. The method according to claim 3, wherein said cassette is one of a plurality of cassettes positioned in a single row in front of said lock chamber.

5. A method of transferring cassettes in operating a vacuum processing apparatus, the vacuum processing apparatus including:

an atmospheric loader, having a location for positioning at least one cassette containing samples, the location having an upper region which is open to a cassette transferring path;

a vacuum loader: and a lock chamber for connecting said atmospheric loader and said vacuum loader, wherein said atmospheric loader includes a cassette mount unit located in front of said lock chamber, and said cassette mount unit has a cassette positioning plane in which cassettes, containing samples to be processed, are positioned in front of a front wall of said lock chamber, said cassette positioning plane being at said location, and an automatic cassette loader for loading cassettes into the atmospheric loader, the method comprising a step of:

placing said cassette on and removing said cassette from said cassette positioning plane of said cassette mount unit by said automatic cassette loader, in accordance with data sent from a host control apparatus.

6. The method according to claim 5, wherein said cassette positioning plane is a plane in which all cassettes, to be positioned in front of the front wall of the lock chamber, are positioned in a single row in front of said front wall.

7. A method of operating a vacuum processing apparatus, the vacuum processing apparatus including:

an atmospheric loader, having a location for positioning at least one cassette containing samples, the location having an upper region which is open to a cassette transferring path;

a vacuum loader; and a lock chamber for connecting said atmospheric loader and said vacuum loader, wherein said atmospheric loader includes a cassette mount unit located in front of said lock chamber, said cassette mount unit has a cassette positioning plane in which all cassettes, containing samples to be processed, are positioned in front of a front wall of said lock chamber, said cassette positioning plane being at said location, and an automatic cassette loader for loading cassettes into the atmospheric loader, the method comprising the steps of:

placing said cassette on said cassette positioning plane, in front of said lock chamber, and removing said cassette, by said automatic cassette loader in accordance with data sent from a host control apparatus; and automatically executing a sample processing in said vacuum processing apparatus, based on processing data.

8. The method according to claim 7, wherein said cassette positioning plane is a plane in which all cassettes, to be positioned in front of the front wall of the lock chamber, are positioned in a single row in front of said front wall.

9. A method of operating a vacuum processing apparatus, the vacuum processing apparatus including:

an atmospheric loader, having a location for positioning at least one cassette containing samples, the location having an upper region which is open to a cassette transferring path;

a vacuum loader; and a lock chamber for connecting said atmospheric loader and said vacuum loader, said lock chamber having opening and closing devices for carry-in samples, to be processed, into the lock chamber and for carrying-out processed samples from the lock chamber, wherein said atmospheric loader includes a cassette mount unit located outside of said lock chamber, and said cassette mount unit has a cassette positioning plane in which all cassettes, containing samples to be processed, are positioned in front of a front wall of said lock chamber, said cassette positioning plane being at said location, wherein the method comprises the steps of:

carrying in a sample, disposed under atmospheric pressure, from a cassette, at said location in said cassette positioning plane, positioned in front of the front wall of said lock chamber, into at least one of a plurality of vacuum processing chambers of said vacuum processing apparatus, using said lock chamber;

processing said sample in said at least one vacuum processing chamber; and carrying out said sample, processed in said at least one vacuum processing chamber, into said atmospheric pressure, using said lock chamber.

wherein the opening and closing devices of the lock chamber are opened and closed every carry-in of a sample, to be processed, to the lock chamber, and every carrying-out of the processed sample from the lock chamber.

10. The method according to claim 9, wherein said cassette positioning plane is a plane in which all of the cassettes are positioned in a single row in front of the front wall of the lock chamber.

11. A method of operating a vacuum processing apparatus, the vacuum processing apparatus including:

an atmospheric loader, having a location for positioning at least one cassette containing samples, the location having an upper region which is open to a cassette transferring path;

a vacuum loader; and a lock chamber for connecting said atmospheric loader and said vacuum loader, said lock chamber having opening and closing devices for carry-in samples, to be processed, into the lock chamber and for carry-out processed samples from the lock chamber, wherein said atmospheric loader includes a cassette mount unit located outside of said lock chamber, and said cassette mount unit has a cassette positioning plane in which all cassettes, containing samples to be processed, are positioned in front of a front wall of said lock chamber, said cassette positioning plane being at said location, wherein the method comprises the steps of:

carrying in a sample, disposed in an atmosphere different than an atmosphere in a plurality of vacuum processing chambers, from a cassette positioned in front of the front wall of the lock chamber, at said location, into at least one of said vacuum processing chambers, using said lock chamber;

processing said sample in said at least one vacuum processing chamber; and carrying out said sample, processed in said at least one vacuum processing chamber, into said atmosphere different from the atmosphere in said at least one vacuum processing chamber, using said lock chamber.

wherein the opening and closing devices of the lock chamber are opened and closed every carry-in of a sample, to be processed, to the lock chamber, and every carrying-out of a processed sample from the lock chamber.

12. The method according to claim 11, wherein said cassette positioning plane is a plane in which all of the cassettes are positioned in a single row in front of the front wall of the lock chamber.

13. A method of treating a sample in plural vacuum processing chambers, comprising the steps of:

placing a cassette, containing the sample, at a position in front of a front wall of a lock chamber, on a cassette table, the cassette table having an upper region thereover which is open to a cassette transferring path, said lock chamber having opening and closing devices for carry-in samples, to be processed, into the lock chamber and for carry-out processed samples from the lock chamber;

carrying in the sample into a vacuum processing chamber, of the plural vacuum processing chambers, using the lock chamber;

processing said sample in said vacuum processing chamber;

carrying out said sample, processed in said vacuum processing chamber, to said cassette, using said lock chamber; and removing said cassette from the cassette table, wherein the opening and closing devices of the lock chamber are opened and closed every carrying-in of a sample, to be processed, to bhe lock chamber, and every carry-out of a processed sample from the lock chamber.

14. The method according to claim 13, wherein the cassette is placed at a position in a single row in front of the front wall of the lock chamber.

15. A method of treating a sample in plural vacuum processing chambers, comprising the steps of:

placing a cassette, containing the sample, on a cassette table, the cassette table having an upper region thereover which is open to a cassette transferring path;

carrying in the sample into a vacuum processing chamber, of the plural vacuum processing chambers, using a lock chamber; in which one sample is to be disposed;

processing said sample in said vacuum processing chamber;

carrying out said sample, processed in said vacuum processing chamber, to said cassette which had contained the sample prior to carrying the sample into the vacuum processing chamber, using said lock chamber; in which one sample is to be disposed; and removing said cassette from the cassette table.

16. A method of treating a sample, comprising the steps of:

placing a cassette, containing the sample, at a position in a single row in front of a front wall of a lock chamber, on a cassette table, the cassette table having an upper region thereover which is open to a cassette transferring path, said lock chamber having opening and closing devices for carry-in samples, to be processed, into the lock chamber and for carry-out processed samples from the lock chamber;

carrying in the sample into a vacuum processing chamber, using the lock chamber;

processing said sample in said vacuum processing chamber; and carrying out said sample, processed in said vacuum processing chamber, using said lock chamber, wherein the opening and closing devices of the lock chamber are opened and closed every carrying-in of a sample, to be processed, to the lock chamber, and every carrying-out of the processed sample from the lock chamber 17. A method of treating a semiconductor wafer in plural vacuum processing chambers, comprising the steps of:

placing a wafer storing structure, containing the semiconductor wafer, at a position in front of a front wall of a lock chamber, on a wafer storing structure table, the wafer storing structure table having an upper region thereover which is open to a wafer storing structure transferring path;

carrying in the semiconductor wafer into a vacuum processing chamber, of the plural vacuum processing chambers, using a lock chamber, in which one semiconductor wafer is to be disposed;

processing said semiconductor wafer in said vacuum processing chamber; and carrying out said semiconductor wafer, processed in said vacuum processing chamber, to said wafer storing structure which had contained the semiconductor wafer prior to carrying the semiconductor wafer into the vacuum processing chamber, using said lock chamber, in which one semiconductor wafer is to be disposed.

18. The method according to claim 17, wherein the wafer storing structure is placed at a position in a single row in front of the front wall of the lock chamber.

19. A method of treating a semiconductor wafer in plural vacuum processing chambers, comprising the steps of:

placing a wafer storing structure, containing the semiconductor wafer, at a position in front of a front wall of a lock chamber, on a wafer storing structure table, the wafer storing structure table having an upper region thereover which is open to a wafer storing structure transferring path;

carrying in the semiconductor wafer into a vacuum processing chamber, of the plural vacuum processing chambers, using the lock chamber;

processing said semiconductor wafer in said vacuum processing chamber; and carrying out said semiconductor wafer, processed in said vacuum processing chamber, to said wafer storing structure which had contained the semiconductor wafer prior to carrying the semiconductor wafer into the vacuum processing chamber, using said lock chamber, in which one semiconductor wafer is to be disposed.

20. The method according to claim 19, wherein the wafer storing structure is placed at a position in a single row in front of the front wall of the lock chamber.

21. A method of treating a sample in plural vacuum processing chambers, comprising the steps of:

placing a cassette, containing the sample, at a position in front of a front wall of a lock chamber, on a cassette table, the cassette being set at a position where an upper region thereof is open to a wafer storing structure transferring path;

carrying in the sample into a vacuum processing chamber, of the plural vacuum processing chambers, using the lock chamber, in which one sample is to be disposed, wherein the sample is carried directly from the cassette to the lock chamber;

processing said sample in said vacuum processing chamber; and carrying out said sample, processed in said vacuum processing chamber, to said cassette which had contained the sample prior to carrying the sample into the vacuum processing chamber, using said lock chamber, in which one sample is to be disposed.

22. The method according to claim 21, wherein said cassette is placed at a position in a single row in front of the front wall of the lock chamber.

23. A method of treating a sample in plural vacuum processing chambers, comprising the steps of:

placing a cassette, containing the sample, at a position in front of a front wall of a lock chamber, on a cassette table, the cassette being set at a position where an upper region thereof is open to a cassette transferring path;

carrying in the sample into a vacuum processing chamber, of the plural vacuum processing chambers, using the lock chamber, in which one sample is to be disposed, wherein the sample is carried directly from the cassette to the lock chamber, samples being transferred from the cassette to the lock chamber;

processing said sample in said vacuum processing chamber; and carrying out said sample, processed in said vacuum processing chamber, to said cassette from which the sample had been carried into the vacuum processing chamber, using said lock chamber, in which one sample is to be disposed.

24. The method according to claim 23 wherein said cassette is placed at a position in a single row in front of the front wall of the lock chamber.

25. A method of treating a sample in plural vacuum Processing chambers, comprising the steps of:
placing a cassette, containing the sample, at a position in a row in front of a front wall of a lock chamber, on a cassette table, disposed at a position where an upper region thereof is open to a cassette transferring path, said lock chamber having opening and closing devices for carry-in samples, to be processed, into the lock chamber and for carry-out processed samples from the lock chamber;
carrying in the sample into a vacuum processing chamber, of the plural vacuum processing chambers, using the lock chamber, whereby the sample is carried into the lock chamber from the cassette;
processing said sample in said vacuum processing chamber; and
carrying out said sample, processed in said vacuum processing chamber, using said lock chamber, whereby the sample is carried out from the lock chamber to the cassette,
wherein the sample is carried from the cassette to the lock chamber in a direction opposite to the direction in which the sample is carried out from the lock chamber to the cassette.
wherein the opening and closing devices of the lock chamber are opened and closed every carry-in of the sample, toe be processed, to the lock chamber, and every carrying-out of the processed sample from the lock chamber.

26. A method of treating a sample in plural vacuum processing chambers, comprising the steps of:
placing a cassette, containing the sample, at a position in a row in front of load and unload lock chambers, the load and unload loak chambers being separate chambers, the cassette being placed on a cassette table, disposed at a position where an upper region thereof is open to a cassette transferring path, each of the load and unload lock chambers having opening and closing devices for carry-in a sample to be processed in a vacuum processing chamber to the load lock chamber and for carry-out a processed sample from the unload lock chamber.
carrying in the sample into a vacuum processing chamber, of the plural vacuum processing chambers, using the load lock chamber;
processing said sample in said vacuum processing chamber; and
carrying out said sample, processed in said vacuum processing chamber, using said unload lock chamber,
wherein the opening and closing devices of the load lock chamber are opened and closed every carrying-in of a sample, to be processed, to the load lock chamber, and every carry-out of a processed sample from the unload lock chamber.

27. A transfer method in operating a vacuum processing apparatus, the vacuum processing apparatus including:
a transfer chamber connected to plural vacuum processing chambers in which substrates to be processed are vacuum processed one-by-one;
a cassette table for mounting a cassette which receives plural substrates to be processed or substrates having been processed, said cassette being mounted to a position where an upper region thereof is open to a cassette transferring path;
a load lock chamber and an unload lock chamber, for carrying in and carrying out said substrates to be processed or said substrates having been processed, from and to said cassette,mounted at said position, and for carrying in and carrying out said substrates to be processed or said substrates having been processed, from and to any of said vacuum processing chambers through said transfer chamber;
one atmospheric transfer apparatus for transferring said substrates to be processed or said substrates having been processed between said cassette mounted at said position and said load lock chamber and said unload lock chamber; and
gate valves provided respectively at an atmospheric side and a vacuum side of said load lock chamber and said unload lock chamber and for opening and closing at every carry-in and carry-out time of said substrates to be processed or said substrates having been processed so as to change over said load lock chamber and said unload lock chamber in an atmospheric atmosphere or a vacuum atmosphere;
wherein the transfer method comprises:
carrying in and carrying out said substrates to be processed or said substrates having been processed, one-by-one, between said load lock chamber or said unload lock chamber at said atmospheric atmosphere and said cassette mounted at said position.

28. The transfer method according to claim 27, including the further step of carrying in and carrying out said substrates to be processed or said substrates having been processed, one-by-one, between said load lock chamber or said unload lock chamber in the vacuum atmosphere and said cassette mounted at said position.

29. The transfer method according to claim 27, including the further step of carrying in and carrying out said substrates to be processed or said substrates having been processed, one-by-one, between said load lock chamber or said unload lock chamber in the vacuum atmosphere and the transfer chamber in the vacuum atmosphere.

30. A transfer method in operating a vacuum processing apparatus, the vacuum processing apparatus including:
a transfer chamber connected to plural vacuum processing chambers in which substrates to be processed are vacuum processed one-by-one;
a cassette table for mounting a cassette which receives plural substrates to be processed or substrates having been processed, the cassette being mounted at a position where an upper region thereof is open to a cassette transferring path;
a load lock chamber for carrying in said substrates to be processed from said cassette mounted at said position and for carrying out said substrates to be processed to any of said vacuum processing chambers through said transfer chamber;
an unload lock chamber for carrying in said substrates having been processed from any of said vacuum processing chambers through said transfer chamber and for carrying out said substrates having been processed to said cassette mounted at said position;
one atmospheric transfer apparatus for transferring said substrates to be processed or said substrates having been processed between said cassette mounted at said position and said load lock chamber and said unload lock chamber; and gate valves provided respectively at an atmospheric side and a vacuum side of said load lock chamber and said unload lock chamber and for opening and closing at every carry-in and carry-out time of said substrates to be processed or said substrates having been processed so as to change over said load lock chamber or said unload lock chamber in an atmospheric atmosphere or a vacuum atmosphere, wherein the transfer method comprises:

carrying in and carrying out said substrates to be processed or said substrates having been processed, one-by-one, between said load lock chamber or said unload lock chamber in the atmospheric atmosphere and said cassette mounted at said position.

31. The transfer method according to claim 30, including the further step of carrying in and carrying out said substrates to be processed or said substrates having been processed, one-by-one, between said load lock chamber or said unload lock chamber in the vacuum atmosphere and said cassette mounted at said position.

32. The transfer method according to claim 30, including the further step of carrying in and carrying out said substrates to be processed or said substrates having been processed, one-by-one, between said load lock chamber or said unload lock chamber in the vacuum atmosphere and the transfer chamber in the vacuum atmosphere.

* * * * *